(12) United States Patent
Park et al.

(10) Patent No.: US 9,793,052 B2
(45) Date of Patent: Oct. 17, 2017

(54) MULTILAYER CERAMIC CAPACITOR, METHOD OF FABRICATION THEREOF AND CIRCUIT BOARD HAVING ELECTRONIC COMPONENT MOUNTED THEREON

(71) Applicant: SAMSUNG ELECTRONICS CO., LTD., Suwon, Gyeonggi-do (KR)

(72) Inventors: Myung Jun Park, Gyunggi-Do (KR); Kyu Sik Park, Gyunggi-Do (KR); Young Sook Lee, Gyunggi-Do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 877 days.

(21) Appl. No.: 13/943,347

(22) Filed: Jul. 16, 2013

(65) Prior Publication Data
US 2014/0290999 A1    Oct. 2, 2014

(30) Foreign Application Priority Data
Mar. 28, 2013   (KR) ........................ 10-2013-0033729

(51) Int. Cl.
| | |
|---|---|
| H05K 1/16 | (2006.01) |
| H01G 4/30 | (2006.01) |
| H01G 4/224 | (2006.01) |
| H01G 4/232 | (2006.01) |

(52) U.S. Cl.
CPC .............. *H01G 4/30* (2013.01); *H01G 4/224* (2013.01); *H01G 4/232* (2013.01); *Y10T 29/417* (2015.01)

(58) Field of Classification Search
CPC ...... H01G 4/2325; H01G 4/232; H01G 4/248; H01B 1/22
USPC ................. 174/260, 250, 251, 255–258, 261
See application file for complete search history.

(56) References Cited

U.S. PATENT DOCUMENTS

| | | | |
|---|---|---|---|
| 4,458,294 A | † | 7/1984 | Womack |
| 5,569,880 A | † | 10/1996 | Galvagni |
| 6,496,355 B1 | † | 12/2002 | Galvagni |

(Continued)

FOREIGN PATENT DOCUMENTS

| | | |
|---|---|---|
| JP | 2006-040910 A | 2/2006 |
| JP | 4844311 B2 | 12/2011 |

(Continued)

OTHER PUBLICATIONS

Korean Office Action issued in Korean Application No. 10-2013-0033729 dated Apr. 21, 2014, w/English translation.

*Primary Examiner* — Tremesha S Willis
(74) *Attorney, Agent, or Firm* — McDermott Will & Emery LLP

(57) ABSTRACT

There is provided a multilayer ceramic capacitor including a ceramic body including a plurality of dielectric layers and having first and second main surfaces opposing each other, first and second side surfaces opposing each other, and first and second end surfaces opposing each other, a plurality of internal electrodes having the dielectric layer interposed therebetween, electrode layers formed on the first and second end surfaces of the ceramic body and electrically connected to the plurality of internal electrodes, and an impact absorption layer formed on the electrode layer so that an edge thereof is exposed.

11 Claims, 6 Drawing Sheets

(56) References Cited

U.S. PATENT DOCUMENTS

| | | | |
|---|---|---|---|
| 7,808,770 B2* | 10/2010 | Itamura | H01G 4/232 361/303 |
| 8,754,335 B2* | 6/2014 | Sato | H01G 4/232 174/260 |
| 2009/0040688 A1 | 2/2009 | Kayatani | |
| 2011/0007449 A1* | 1/2011 | Seo | H01G 4/232 361/321.2 |

FOREIGN PATENT DOCUMENTS

| KR | 2005-0102767 A | 10/2005 |
|---|---|---|
| KR | 10-2008-0111557 A | 12/2008 |

\* cited by examiner
† cited by third party

MULTILAYER CERAMIC CAPACITOR, METHOD OF FABRICATION THEREOF AND CIRCUIT BOARD HAVING ELECTRONIC COMPONENT MOUNTED THEREON

CROSS-REFERENCE TO RELATED APPLICATIONS

This application claims the priority of Korean Patent Application No. 10-2013-0033729 filed on Mar. 28, 2013, in the Korean Intellectual Property Office, the disclosure of which is incorporated herein by reference.

BACKGROUND OF THE INVENTION

Field of the Invention

The present invention relates to a multilayer ceramic capacitor having external electrodes in which equivalent series resistance is not increased and an impact absorption rate is improved, a method of fabrication thereof and a circuit board having an electronic component mounted thereon.

Description of the Related Art

Generally, electronic components using a ceramic material, such as a capacitor, an inductor, a piezoelectric element, a varistor, a thermistor, or the like, include a ceramic body formed of a ceramic material, internal electrodes formed in the ceramic body, and external electrodes mounted on external surfaces of the ceramic body so as to be connected to the internal electrodes.

Among the ceramic electronic components, a multilayer ceramic capacitor is configured to include a plurality of laminated dielectric layers, internal electrodes disposed to face each other, having the dielectric layer interposed therebetween, and external electrodes electrically connected to the internal electrodes.

Multilayer ceramic capacitors have been widely used as components in computers and mobile communications devices such as personal digital assistants (PDAs), mobile phones, or the like, due to advantages thereof such as a small size, high capacity, ease of mounting, and the like.

Recently, as electronic products have been miniaturized and have had multifunctionalization implemented therein, chip components have also tended to be miniaturized and to have multifunctionalization implemented therein. As a result, there is a need to miniaturize multilayer ceramic capacitors and increase the capacity thereof.

In addition, multilayer ceramic capacitors have been usefully used as bypass capacitors disposed in a power supply circuit in a large scale integration (LSI) scheme. Multilayer ceramic capacitors need to have the capability to effectively remove high frequency noise in order to serve as bypass capacitors. This demand has been further increased in accordance with the trend toward electronic devices having high frequencies. The multilayer ceramic capacitor used as the bypass capacitor may be electrically connected to a mounting pad on a circuit board through soldering, and the mounting pad may be connected to other external circuits through wiring patterns or conductive vias on the circuit board.

The multilayer ceramic capacitor has equivalent series resistance (ESR) and equivalent series inductance (ESL) components in addition to a capacitance component. These ESR and ESL components may hinder a function of the bypass capacitor.

Therefore, the multilayer ceramic capacitor having low equivalent series resistance (ESR) has been demanded.
[Related Art Document]
Korean Patent No. KR 10-0586962

SUMMARY OF THE INVENTION

An aspect of the present invention provides a multilayer ceramic capacitor having external electrodes in which equivalent series resistance (ESR) is not increased and an impact absorption rate is improved, a method of fabrication thereof and a circuit board having an electronic component mounted thereon.

According to an aspect of the present invention, there is provided a multilayer ceramic capacitor including: a ceramic body including a plurality of dielectric layers and having first and second main surfaces opposing each other, first and second side surfaces opposing each other, and first and second end surfaces opposing each other; a plurality of internal electrodes having the dielectric layer interposed therebetween; electrode layers formed on the first and second end surfaces of the ceramic body and electrically connected to the plurality of internal electrodes; and an impact absorption layer formed on the electrode layer so that an edge thereof is exposed.

The electrode layer and the impact absorption layer may be extended from the first and second end surfaces to the first and second main surfaces or the first and second side surfaces of the ceramic body.

When a length of the electrode layer formed on the first and second main surfaces or the first and second side surfaces of the ceramic body is B1, and a length of the impact absorption layer formed on the first and second main surfaces or the first and second side surfaces of the ceramic body is B2, $0.05 \leq B2/B1 < 0.95$ may be satisfied.

The multilayer ceramic capacitor may further include a plating layer formed on the impact absorption layer.

The plating layer may be formed so as to cover an edge of the electrode layer.

The electrode layer may be a sintered type electrode.

The impact absorption layer may include a thermosetting polymer.

According to an aspect of the present invention, there is provided a method of fabricating a multilayer ceramic capacitor, the fabricating method including: preparing a plurality of ceramic green sheets; forming an internal electrode pattern on the plurality of ceramic green sheets; forming a ceramic multilayer body by multilayering the ceramic green sheets having the internal electrode pattern formed thereon; forming a ceramic body having first and second main surfaces opposing each other, first and second side surfaces opposing each other, and first and second end surfaces opposing each other by cutting and sintering the ceramic multilayer body so that one ends of the internal electrode patterns are alternately exposed through the end surfaces thereof; forming electrode layers on the first and second end surfaces of the ceramic body so as to be electrically connected to one ends of the internal electrodes; and forming an impact absorption layer on the electrode layer so that an edge thereof is exposed.

The electrode layer and the impact absorption layer may be extended from the first and second end surfaces to the first and second main surfaces or the first and second side surfaces of the ceramic body.

When a length of the electrode layer formed on the first and second main surfaces or the first and second side surfaces of the ceramic body is B1, and a length of the impact absorption layer formed on the first and second main surfaces or the first and second side surfaces of the ceramic body is B2, 0.05≤B2/B1<0.95 may be satisfied.

The fabricating method may further include, after the forming of the impact absorption layer, forming a plating layer on the impact absorption layer.

The plating layer may be formed so as to cover an edge of the electrode layer.

The electrode layer may be formed by applying a paste containing a conductive metal and performing a sintering process thereon.

The impact absorption layer may include a thermosetting polymer.

According to an aspect of the present invention, there is provided a circuit board having an electronic component mounted thereon, the circuit board including: a printed circuit board having first and second electrode pads thereon; and a multilayer ceramic capacitor installed on the printed circuit board, wherein the multilayer ceramic capacitor includes a ceramic body including a plurality of dielectric layers and having first and second main surfaces opposing each other, first and second side surfaces opposing each other, and first and second end surfaces opposing each other; a plurality of internal electrodes having the dielectric layer therebetween; electrode layers formed on the first and second end surfaces of the ceramic body and electrically connected to the plurality of internal electrodes; and an impact absorption layer formed on the electrode layer so that an edge of the electrode layer is exposed.

The multilayer ceramic capacitor may further include a plating layer formed on the impact absorption layer.

The plating layer may be formed so as to cover an edge of the electrode layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

Multilayer Ceramic Capacitor 100

Figure 1:
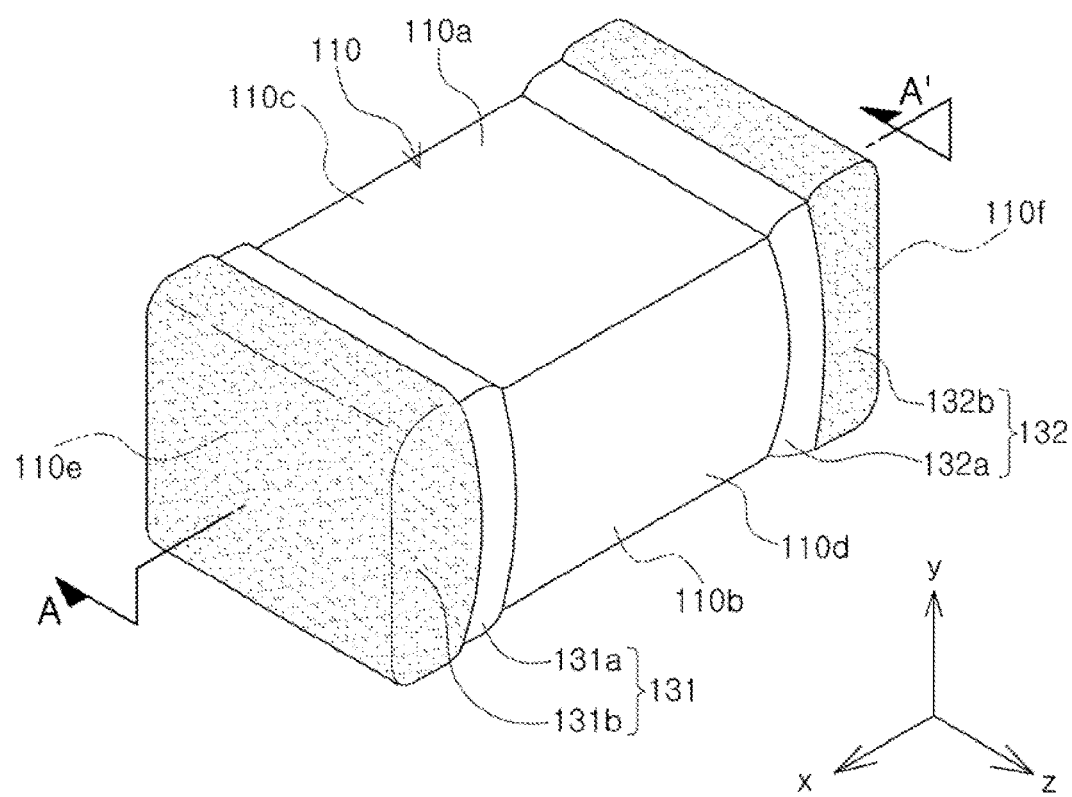
FIG. 1 is a schematic perspective view showing a multilayer ceramic capacitor according to an embodiment of the present invention.

FIG. 1 is a schematic perspective view showing a multilayer ceramic capacitor according to an embodiment of the present invention.

Figure 2:
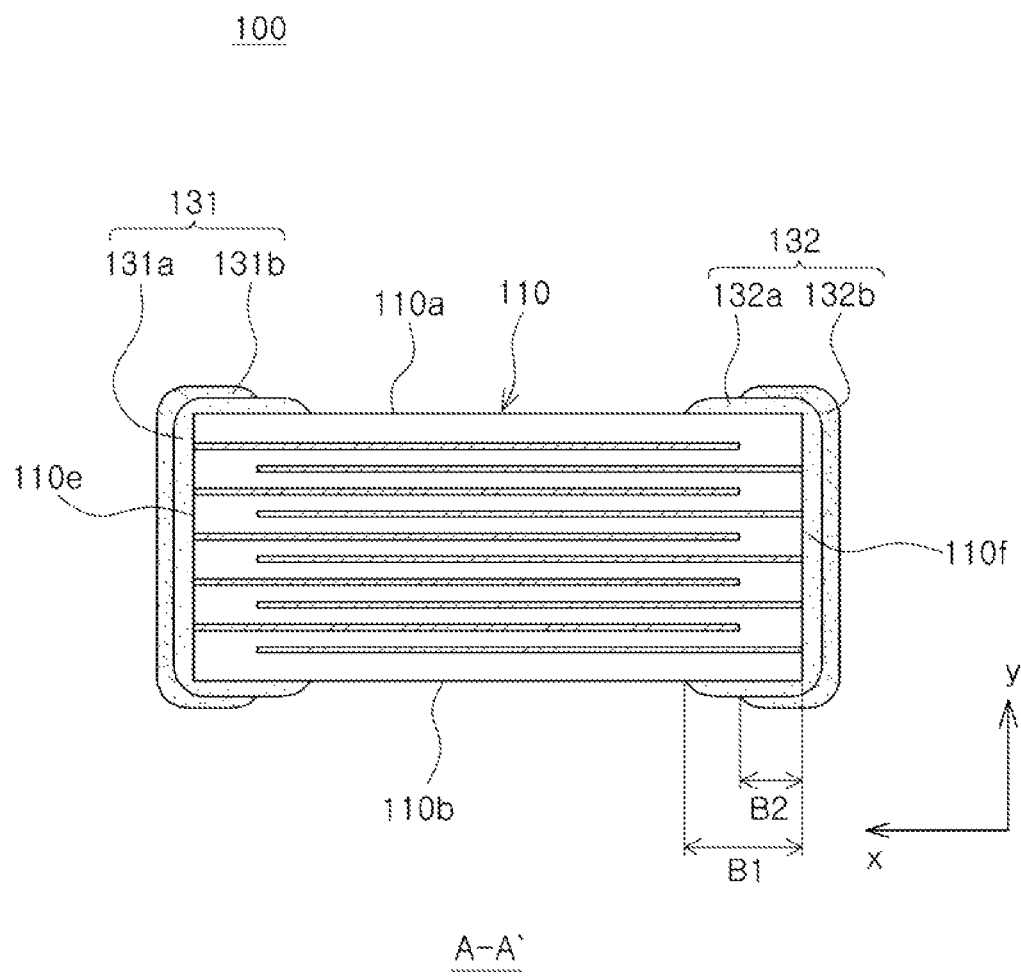
FIG. 2 is a cross-sectional view taken along line A-A' of FIG. 1.

FIG. 2 is a cross-sectional view taken along line A-A' of FIG. 1.

Referring to FIG. 1, the multilayer ceramic capacitor according to the embodiment of the present invention may include a ceramic body 110; and first and second external electrodes 131 and 132.

In the embodiment of the present invention, the ceramic body 110 may have a first main surface 110a and a second main surface 110b opposing each other, a first side surface 110c and a second side surface 110d connecting the first main surface and the second main surface to each other, a first end surface 110e, and a second end surface 110f. A shape of the ceramic body 110 is not particularly limited. However, the ceramic body 110 may have a hexahedral shape as shown in the drawings. At the time of sintering a chip, the ceramic body 110 may have a substantially hexahedral shape, even though it may not be hexahedral shape having entirely parallel lines due to the sintering shrinkage of a ceramic powder.

As shown in FIG. 2, a cross-sectional view of the multilayer ceramic capacitor, the ceramic body may include a plurality of dielectric layers 111 and first and second internal electrodes 121 and 122 formed on the dielectric layer 111, and may be formed by stacking a plurality of the dielectric layers having the internal electrodes formed thereon.

The ceramic body 110 may include an active layer in a portion contributing to the formation of capacitance in the capacitor, and upper and lower cover layers formed above and below the active layer as upper and lower margin parts, respectively. The active layer may include the dielectric layer 111 and the internal electrodes 121 and 122, and a plurality of first and second internal electrodes 121 and 122 may be alternately stacked, having the dielectric layer 111 therebetween.

According to the embodiment of the present invention, a y-direction refers to a thickness direction of the ceramic body in which the internal electrodes are stacked, having a dielectric layer interposed therebetween, an x-direction refers to a length direction of the ceramic body, and a z-direction refers to a width direction of the ceramic body.

The ceramic body 110 may have a length longer than a thickness thereof.

According to the embodiment of the present invention, a plurality of dielectric layers 111 configuring the ceramic body 110 are in a sintered state and may be integrated with one another such that boundaries between dielectric layers adjacent to each other may not be readily apparent.

The first and second internal electrodes 121 and 122, a pair of electrodes having different polarities, may be formed on the dielectric layer 111 by printing a layer of conductive paste containing a conductive metal and having a predetermined thickness on the dielectric layer such that when dielectric layers are cut into individual chips, compressed and sintered, the first and second internal electrodes 121 and 122 are alternately exposed through both end surfaces of the ceramic body in a direction perpendicular to the stacking direction of the dielectric layer 111, and may be electrically insulated by the dielectric layer 111 disposed between the internal electrodes.

That is, the first and second internal electrodes 121 and 122 may be electrically connected to the first and second external electrodes 131 and 132 through portions thereof alternately exposed through both end surfaces of the ceramic body 110, respectively.

Therefore, when a predetermined amount of voltage is applied to the first and second external electrodes 131 and 132, electric charges are accumulated between the first and second internal electrodes 121 and 122 facing each other. Here, capacitance of the multilayer ceramic capacitor 100 is in proportion to an area of a region in which the first and second internal electrodes 121 and 122 are overlapped with each other.

Each thickness of the first and second internal electrode layers 121 and 122 may be determined according to the use thereof. For example, when considering the size of the ceramic body 110, the thickness may be determined so as to be within a range of 0.2 to 1.0 μm, but the present invention is not limited thereto.

In addition, the conductive metal included in the first and second internal electrodes 121 and 122 may be nickel (Ni), copper (Cu), palladium (Pd), or an alloy thereof, but the present invention is not limited thereto.

Here, a thickness of the dielectric layer 111 may be discretionally changed according to a capacitance design of the multilayer ceramic capacitor. Specifically, a thickness of one layer of the dielectric layer 111 after a sintering process may be set to be 0.1 to 10 μm. However, the present invention is not limited thereto.

In addition, the dielectric layer 111 may include a ceramic powder having high dielectric constant, for example, a barium titanate ($BaTiO_3$)-based powder, or a strontium titanate ($SrTiO_3$)-based powder. However, the present invention is not limited thereto.

The upper and lower cover layers may have the quality of the material and construction which are the same as those of the dielectric layer 11 while not including the internal electrode. The upper and lower cover layers may be formed by vertically stacking a single dielectric layer or two or more dielectric layers above and below the active layer, respectively, and may serve to prevent damage to the first and second internal electrodes 121 and 122 by physical or chemical stress.

The first external electrode 131 may be electrically connected to the first internal electrode 121 and the second external electrode 132 may be electrically connected to the second internal electrode 122.

The first and second external electrodes 131 and 132 may include electrode layers 131a and 132a and impact absorption layers 131b and 132b, respectively.

The electrode layers 131a and 132a may be directly connected to the first and second internal electrodes 121 and 122 to secure an electrical connection between the external electrodes and the internal electrodes.

The electrode layers 131a and 132a may include the conductive metal, and the conductive metal may be nickel (Ni), copper (Cu), palladium (Pd), gold (Au), or an alloy thereof, but the present invention is not limited thereto.

The electrode layers 131a and 132a may be a sintered type electrode formed by sintering the paste containing the conductive metal.

The impact absorption layers 131b and 132b may be disposed on the electrode layers 131a and 132a, and the impact absorption layer may be formed so that an edge of the electrode layer is exposed.

That is, the impact absorption layer may have an area smaller than that of the electrode layer.

In addition, the electrode layers 131a and 132a and the impact absorption layers 131b and 132b may be extended from the first and second end surfaces to the first and second main surfaces or the first and second side surfaces of the ceramic body. That is, the electrode layers 131a and 132a and the impact absorption layers 131b and 132b may be extended so as to cover from the first and second end surfaces to portions of the first and second main surfaces or the first and second side surfaces.

However, in the case in which the electrode layers and the impact absorption layers are formed so as to be extended up to portions of the first and second main surfaces or the first and second side surfaces, the impact absorption layer may be formed so that the edge of the electrode layer is exposed.

In other words, when portions formed on the first and second main surfaces or the first and second side surfaces in the electrode layers 131a and 132a and the impact absorption layers 131b and 132b are electrode layer band parts, and an impact absorption layer band parts, respectively, a length of the electrode layer band part is B1, and a length of the impact absorption layer band part is B2, the electrode layers and the impact absorption layers may be formed to satisfy B1>B2.

According to the embodiment of the present invention, the electrode layers 131a and 132a are not entirely covered by the impact absorption layers 131b and 132b but partially exposed, such that an electrical current may flow to the outside without passing through the impact absorption layer.

In the case of fabricating the multilayer ceramic capacitor so that the impact absorption layers 131b and 132b entirely cover the electrode layers 131a and 132a, the electrical current necessarily flows through the impact absorption layer for an electrical connection to the outside.

Therefore, in this case, since the impact absorption layer should be electrically connected, the impact absorption layer may include a conductive metal powder for securing electrical conductivity and a base resin for impact absorption. However, in the case in which the impact absorption layer includes the base resin, the impact absorption layer may have a specific resistance value higher than that of the electrode layer, such that equivalent serial resistance (ESR) of the multilayer ceramic capacitor may be increased.

However, in the case in which the impact absorption layers 131b and 132b do not cover the electrode layers 131a and 132a but the edges of the electrode layers 131a and 132a are exposed according to the embodiment of the present invention, the electrical current does not pass through the impact absorption layer but passes through the electrode layer to flow from the internal electrode to the outside.

In the case in which there are many routes along which the electrical current flows, since the electrical current flows along the route having a low specific resistance value, the electrical current may be electrically connected to the outside through the exposed edge of the electrode layer rather than the impact absorption layer.

In other words, in the embodiment of the present invention, since the electrical current flows through the route of the internal electrode-electrode layer-the outside, the ESR may be prevented from being increased by the impact absorption layer.

Therefore, the impact absorption layer does not necessarily include the conductive metal for securing the conductivity, but may include only the base resin to significantly improve an impact absorption rate as compared to the related art.

The impact absorption layers 131b and 132b may include a thermosetting polymer, for example, an epoxy resin, an acrylic resin, or a mixture thereof, but the present invention is not limited thereto.

In addition, the multilayer ceramic capacitor according to the embodiment of the present invention may satisfy 0.05≤B2/B1<0.95, wherein B1 is a length of the electrode layer band part, and B2 is a length of the impact absorption layer band part.

In the case in which B2/B1 is less than 0.05, the multilayer ceramic capacitor may not have reliability secured therein, and in the case in which B2/B1 is 0.95 or more, since the exposed area of the electrode layer is relatively small, the route for the electrical current to flow may not be sufficiently secured, such that the ESR may be increased.

Therefore, B2/B1 may satisfy 0.05≤B2/B1<0.95.

Figure 3:
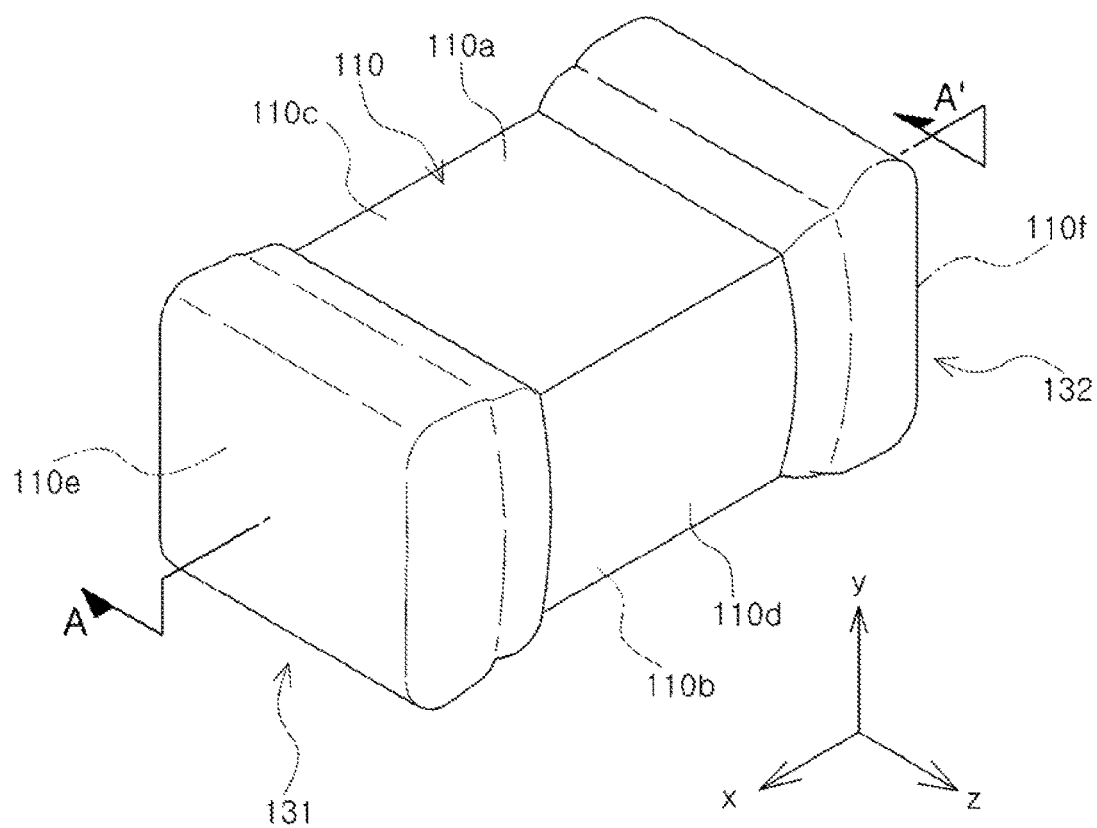
FIG. 3 is a schematic perspective view showing a multilayer ceramic capacitor according to another embodiment of the present invention.
Figure 4:
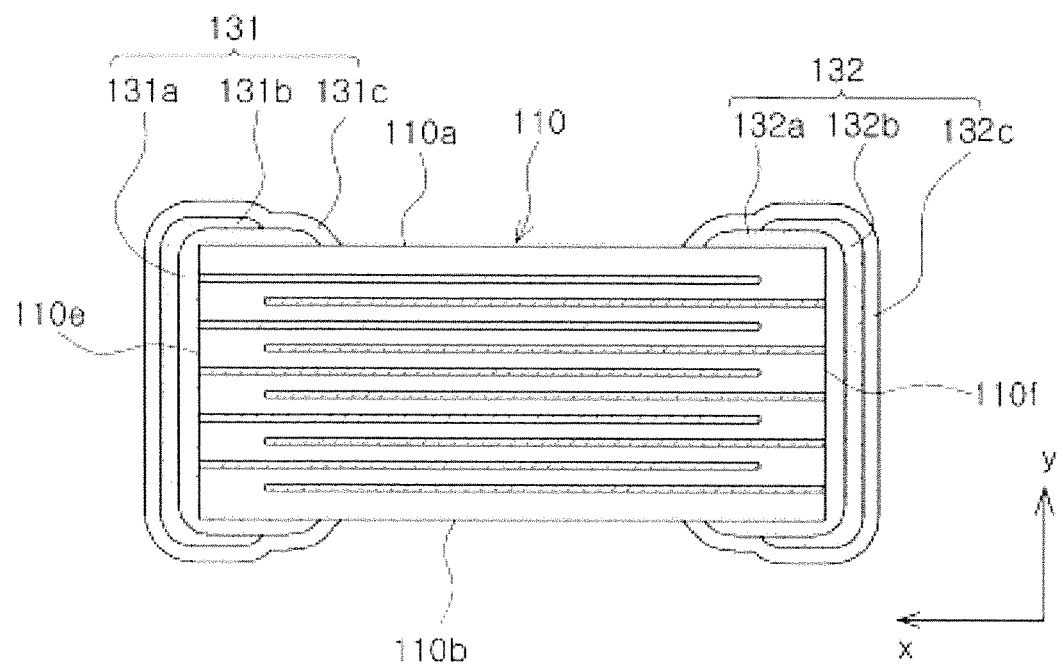
FIG. 4 is a cross-sectional view taken along line A-A' of FIG. 3.

FIG. 3 is a schematic perspective view showing a multilayer ceramic capacitor according to another embodiment of the present invention, and FIG. 4 is a cross-sectional view taken along line A-A' of FIG. 3.

Referring to FIG. 3, the multilayer ceramic capacitor according to the embodiment of the present invention may include the ceramic body 110 and the first and second external electrodes 131 and 132, and referring to FIG. 4, the first and second external electrodes 131 and 132 may include the electrode layers 131a and 132a, the impact absorption layers 131b and 132b formed so that the edge of the electrode layer is exposed, and plating layers 131c and 132c, respectively.

Descriptions related to the multilayer ceramic capacitor according to the embodiment of the present invention overlapped with the above-description of the multilayer ceramic capacitor according to the afore-described embodiment of the present invention will be omitted, and differences therebetween will mainly be described.

The plating layers 131c and 132c may be formed on the impact absorption layers 131b and 132b, and may be formed to be in contact with the electrode layers 131a and 132a. Therefore, the electrode layer may be electrically connected to the plating layer.

In addition, the plating layers 131c and 132c may be formed so as to cover the entire electrode layers 131a and 132a including the edge thereof.

In the case in which the plating layers 131c and 132c are formed, the electrical current may be electrically conducted through the route of internal electrode-electrode layer-plating layer-the outside, and may prevent ESR from being increased by the impact absorption layer as described in the above-mentioned embodiment of the present invention.

The plating layers 131c and 132c are not particularly limited, but may include nickel (Ni) or tin (Sn).

In addition, the plating layer may be formed as a dual layer, wherein a nickel (Ni) plating layer may be formed on the impact absorption layer, and a tin (Sn) plating layer may be formed on the nickel (Ni) plating layer, but the present invention is not limited thereto.

Method of Fabricating Multilayer Ceramic Capacitor 100

According to another embodiment of the present invention, a method of fabricating a multilayer ceramic capacitor may be provided.

The method of fabricating the multilayer ceramic capacitor according to the embodiment of the present invention may include: preparing a plurality of ceramic green sheets; forming an internal electrode pattern on the plurality of ceramic green sheets; stacking the ceramic green sheets having the internal electrode pattern formed thereon to form a ceramic multilayer body; cutting and sintering the ceramic multilayer body so that one ends of the internal electrode patterns are alternately exposed through the end surfaces thereof to thereby form a ceramic body having first and second main surfaces opposing each other, first and second side surfaces opposing each other, and first and second end surfaces opposing each other; forming a respective electrode layer on the first and second end surfaces of the ceramic body so as to be electrically connected to one ends of the internal electrodes; and forming an impact absorption layer on the electrode layer so that an edge thereof is exposed.

Hereinafter, the method of fabricating the multilayer ceramic capacitor according to the embodiment of the present invention will be described, but the present invention is not limited thereto.

In addition, descriptions of the method of fabricating the multilayer ceramic capacitor according to the embodiment of the present invention overlapped with the above-description of the multilayer ceramic capacitor according to the afore-mentioned embodiment of the present invention will be omitted.

In the method of fabricating the multilayer ceramic capacitor according to the embodiment of the present invention, firstly, slurry containing a powder such as a barium titanate ($BaTiO_3$) powder, or the like, may be applied and dried onto a carrier film to prepare a plurality of ceramic green sheets, thereby forming the dielectric layer and the cover layer.

The ceramic green sheet may be fabricated by mixing ceramic powder, a binder, and a solvent to prepare the slurry, and forming the prepared slurry as a sheet having a thickness of several μm using a doctor blade method.

Then, a conductive paste for internal electrode containing a conductive powder may be prepared.

After the conductive paste for internal electrode is applied on the ceramic green sheet by a screen printing method to form the internal electrode, a plurality of ceramic green sheets having the printed internal electrodes may be stacked, and a plurality of ceramic green sheets not having the internal electrodes printed thereon may be stacked and sintered on upper and lower surfaces of the multilayer body to fabricate the ceramic body 110. The ceramic body may include the internal electrodes 121 and 122, the dielectric layer 111, and a cover layer, wherein the dielectric layer is formed by sintering the green sheet having the printed internal electrode, and the cover layer is formed by sintering the green sheet not having the internal electrode printed thereon.

The internal electrode may be configured of first and second internal electrodes.

The electrode layers 131a and 132a may be formed on the outer surfaces of the ceramic body 110 so as to be electrically connected to the first and second internal electrodes. The electrode layers may be formed by sintering a paste containing a conductive metal and a glass.

The conductive metal is not particularly limited, but for example, may be at least one selected from a group consisting of copper (Cu), silver (Ag), nickel (Ni), and an alloy thereof, and specifically, may include copper (Cu) as described above.

The glass is not particularly limited, but a material having the same composition as the glass used in fabricating the external electrode of the general multilayer ceramic capacitor may be used for the glass.

The impact absorption layers 131b and 132b may be formed by applying a resin composition to an outer surface of the electrode layer. The resin composition may include the conductive powder and the base resin, and the base resin may be the epoxy resin, a thermosetting resin, but the present invention is not limited thereto.

In addition, the resin composition may not include the conductive powder.

Further, after the impact absorption layer is formed, the plating layers 131c and 132c may be formed on the impact absorption layers, and the plating layer may include a nickel plating layer and a tin plating layer formed on the nickel plating layer.

Circuit Board Having Electronic Component Mounted Thereon (200)

Figure 5:
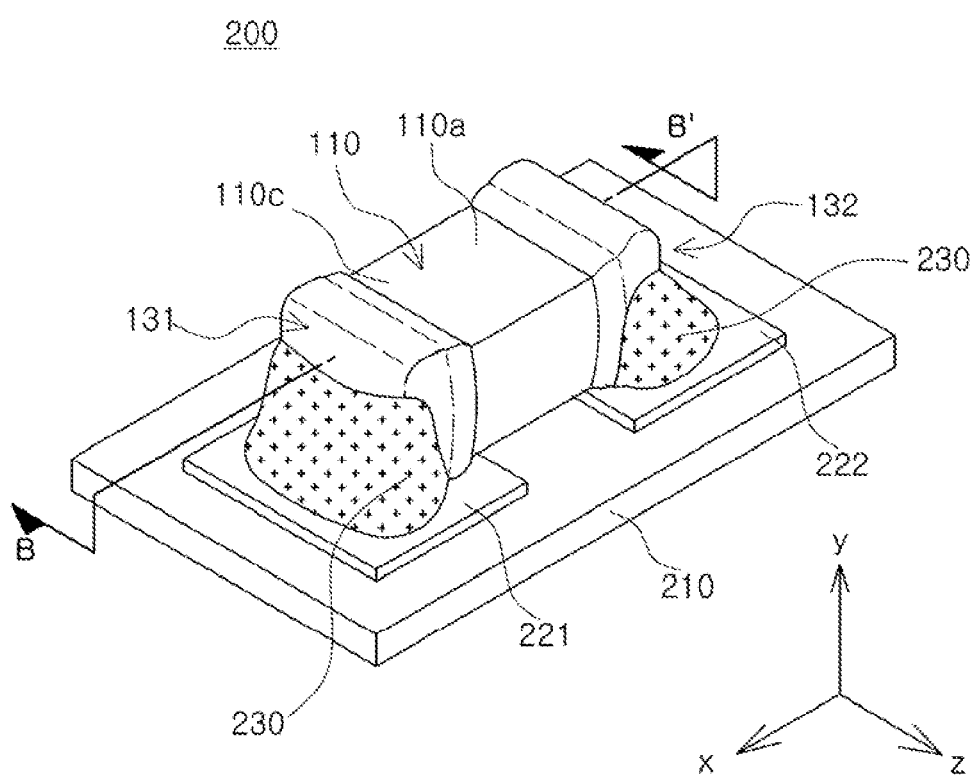
FIG. 5 is a perspective view showing a circuit board having an electronic component mounted thereon according to another embodiment of the present invention.

FIG. 5 is a perspective view showing a circuit board having an electronic component mounted thereon according to another embodiment of the present invention.

Figure 6:
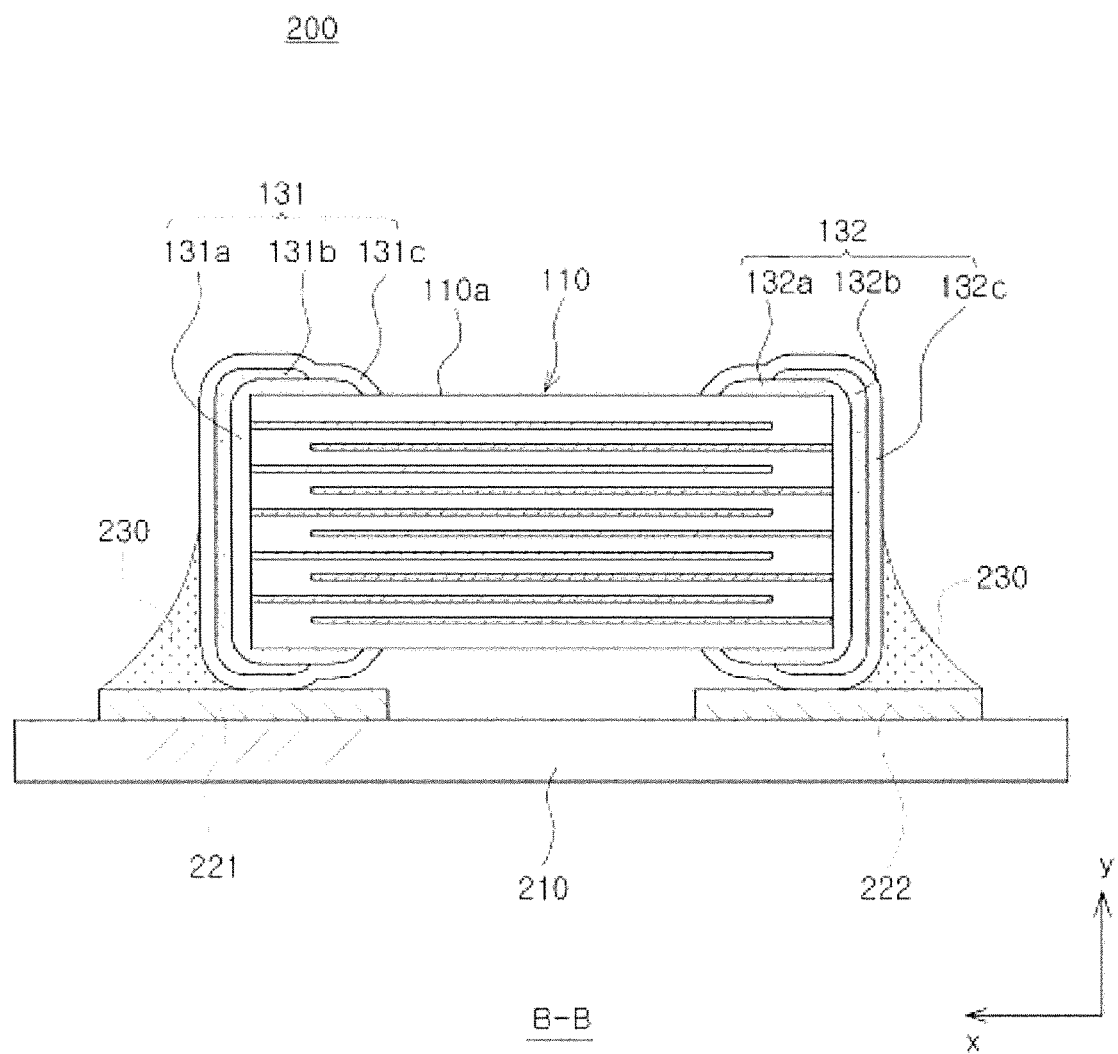
FIG. 6 is a cross-sectional view taken along line B-B' of FIG. 5.

FIG. 6 is a cross-sectional view taken along line B-B' of FIG. 5.

Referring to FIGS. 5 and 6, the circuit board having the electronic component mounted thereon according to the embodiment of the present invention may include a printed circuit board 210 having first and second electrode pads 221 and 222 thereon; and a multilayer ceramic capacitor 100 installed on the printed circuit board.

Here, the multilayer ceramic capacitor 100 may be electrically connected to the printed circuit board 210 by a solder 230 in a state in which the first and second external electrodes 131 and 132 are positioned so as to contact the first and second electrode pads 221 and 222, respectively.

Descriptions of the above-described multilayer ceramic capacitor in the description of the circuit board having the multilayer ceramic capacitor mounted thereon will be omitted.

Experimental Example

Table 1 below shows examination results obtained by evaluating equivalent series resistance (ESR), adhesion strength, and reliability of the multilayer ceramic capacitor according to a ratio (B2/B1) of a length B1 of electrode layer band part to a length B2 of an impact absorption layer band part.

Multilayer ceramic capacitors according to Inventive Example and Comparative Examples of the present invention were fabricated as follows.

A slurry containing a powder such as barium titanate (BaTiO), or the like, was applied to a carrier film and dried thereon to prepare a plurality of ceramic green sheets having a thickness of 1.8 μm.

Then, an internal electrode was formed by applying a conductive paste for a nickel internal electrode to the ceramic green sheet using a screen.

The ceramic green sheets were stacked so as to have about 370 layers, wherein the ceramic green sheets without the internal electrode formed thereon were stacked in upper and lower parts thereof to prepare a multilayer body. The multilayer body was isostatically pressed at a pressure of 1,000 kgf/cm$^2$ at a temperature of 85° C.

The ceramic multilayer body of which pressing is completed was cut into an individual chip form and the cut chip was subjected to debinding treatment by being maintained at a temperature of 230° C. and in the air atmosphere for 60 hours.

Then, the ceramic multilayer body was sintered at a temperature of 1200° C. under a reduction atmosphere having an oxygen partial pressure of $10^{-11}$ atm to $10^{-10}$ atm lower than oxygen partial pressure in a state in which Ni/NiO are balanced, such that the internal electrode is not oxidized. A chip size of the multilayer chip capacitor after the sintering had a length L×width W of about 1.0 mm×0.5 mm (L×W, 1005 size). Here, a fabrication tolerance ranged within ±0.1 mm as a length×width (L×W), and in the case of satisfying the range, the electrode layer, the impact absorption layer, and the plating layer were formed. The electrode layer was fabricated by applying a paste containing copper (Cu) and performing a sintering process thereon, and the impact absorption layer was fabricated by applying a paste containing copper (Cu) and an epoxy resin and performing a hardening process. A nickel (Ni) plating layer was used for the plating layer.

Next, the fabricated multilayer ceramic capacitor was evaluated in view of equivalent series resistance (ESR), adhesion strength, and reliability.

At the time of evaluating the reliability, the case in which insulation resistance (IR) is decreased below the standard value and short-circuit occurs was determined as NG.

TABLE 1

| Sample | B2/B1 | ESR (mΩ) | Adhesion Strength (g · f) | Reliability (Number of NGs) |
|---|---|---|---|---|
| 1* | 0.95 ≤ B2/B1 | 184 | 840 | 0/400 |
| 2 | 0.75 ≤ B2/B1 < 0.95 | 23 | 1083 | 0/400 |
| 3 | 0.50 ≤ B2/B1 < 0.75 | 14 | 1227 | 0/400 |
| 4 | 0.25 ≤ B2/B1 < 0.55 | 17 | 1141 | 0/400 |
| 5 | 0.05 ≤ B2/B1 < 0.25 | 13 | 1465 | 0/400 |
| 6* | B2/B1 < 0.05 | 15 | 1683 | 18/400 |

*indicates Comparative Example.

As shown in Table 1 above, when the case in which B2/B1 is 0.95 is a based boundary and 0.95≤≤B2/B1 is satisfied, the ESR is rapidly increased, and the adhesion strength is decreased less than 1000 g·f. In addition, in the case in which B2/B1<0.05 is satisfied, the number of multilayer ceramic capacitors evaluated as NG is increased, such that reliability is deteriorated.

Therefore, as described above, B2/B1 may be required to satisfy 0.05≤B2/B1<0.95.

As set forth above, according to the embodiment of the present invention, the multilayer ceramic capacitor having the external electrodes in which the equivalent series resistance is not increased and the impact absorption rate is improved, the method of fabrication thereof and the circuit board having the electronic component mounted thereon, may be provided.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
a ceramic body including a plurality of dielectric layers;
a plurality of internal electrodes having at least one of the dielectric layers interposed therebetween;
an electrode layer formed on a surface of the ceramic body and electrically connected to the plurality of internal electrodes;
an outer electrode layer formed on the electrode layer; and
an impact absorption layer formed between the electrode layer and the outer electrode layer and including a base resin,
wherein the outer electrode layer directly contacts the electrode layer, and
wherein the outer electrode layer is a plating layer.

2. The multilayer ceramic capacitor of claim 1, wherein the ceramic body has first and second main surfaces opposing each other, first and second side surfaces opposing each other, and first and second end surfaces opposing each other, and the electrode layer and the impact absorption layer extend from the first and second end surfaces to the first and second main surfaces or the first and second side surfaces of the ceramic body.

3. The multilayer ceramic capacitor of claim 2, wherein when a length of the electrode layer formed on the first and second main surfaces or the first and second side surfaces of the ceramic body is B1, and a length of the impact absorption layer formed on the first and second main surfaces or the first and second side surfaces of the ceramic body is B2, $0.05 \leq B2/B1 < 0.95$ is satisfied.

4. The multilayer ceramic capacitor of claim 1, wherein the plating layer is formed so as to cover an edge of the electrode layer.

5. The multilayer ceramic capacitor of claim 1, wherein the electrode layer is a sintered type electrode.

6. The multilayer ceramic capacitor of claim 1, wherein the impact absorption layer includes a thermosetting polymer.

7. A circuit board having an electronic component mounted thereon, the circuit board comprising:
   a printed circuit board having first and second electrode pads thereon; and
   a multilayer ceramic capacitor installed on the printed circuit board,
   wherein the multilayer ceramic capacitor includes: a ceramic body including a plurality of dielectric layers; a plurality of internal electrodes having at least one of the dielectric layers interposed therebetween; an electrode layer formed on a surface of the ceramic body and electrically connected to the plurality of internal electrodes; an outer electrode layer formed on the electrode layer; an impact absorption layer formed between the electrode layer and the outer electrode layer and including a base resin; and
   wherein the outer electrode layer directly contacts the electrode layer, and
   wherein the outer electrode layer is a plating layer.

8. The circuit board of claim 7, wherein the plating layer is formed so as to cover an edge of the electrode layer.

9. The multilayer ceramic capacitor of claim 1, wherein the outer electrode layer covers an entirety of the impact absorption layer and the electrode layer.

10. The multilayer ceramic capacitor of claim 1, wherein the impact absorption layer is non-conductive and is formed directly on the electrode layer.

11. The circuit board of claim 7, wherein the impact absorption layer is non-conductive and is formed directly on the electrode layer.

* * * * *